(12) United States Patent
Sui et al.

(10) Patent No.: US 11,495,699 B2
(45) Date of Patent: Nov. 8, 2022

(54) THIN-FILM PHOTOVOLTAIC CELL WITH HIGH PHOTOELECTRIC CONVERSION RATE AND PREPARATION PROCESS THEREOF

(71) Applicant: TRUWIN OPTO-ELECTRONICS LIMITED, Guang Dong (CN)

(72) Inventors: Bin Sui, Guangdong (CN); Weicang Zhang, Guangdong (CN); Xiongcai Xie, Guangdong (CN); Wenjin Zhang, Guangdong (CN); Liang Yang, Guangdong (CN)

(73) Assignee: TRUWIN OPTO-ELECTRONICS LIMITED, Guang Dong (CN)

( * ) Notice: Subject to any disclaimer, the term of this patent is extended or adjusted under 35 U.S.C. 154(b) by 112 days.

(21) Appl. No.: 16/960,315

(22) PCT Filed: Feb. 27, 2020

(86) PCT No.: PCT/CN2020/077010
§ 371 (c)(1),
(2) Date: Jul. 6, 2020

(87) PCT Pub. No.: WO2021/056962
PCT Pub. Date: Apr. 1, 2021

(65) Prior Publication Data
US 2021/0408304 A1    Dec. 30, 2021

(30) Foreign Application Priority Data

Sep. 29, 2019    (CN) .......................... 201910931288.7

(51) Int. Cl.
*H01L 31/0224* (2006.01)
*H01L 31/0468* (2014.01)
(Continued)

(52) U.S. Cl.
CPC ............... *H01L 31/022441* (2013.01); *H01L 31/022466* (2013.01); *H01L 31/0468* (2014.12); *H01L 31/1888* (2013.01); *G06F 1/1684* (2013.01)

(58) Field of Classification Search
None
See application file for complete search history.

(56) References Cited

U.S. PATENT DOCUMENTS 6,791,905 B1 * 9/2004 Sekiguchi .............. G04C 10/02
                                                          368/80
8,130,440 B2 * 3/2012 Kothari .............. G02B 26/0841
                                                          359/290
(Continued)

FOREIGN PATENT DOCUMENTS

CN          107644887          1/2018
CN          108230908          6/2018
(Continued)

OTHER PUBLICATIONS

"Office Action of Japan Counterpart Application", dated Sep. 21, 2021, p. 1-p. 4.
(Continued)

*Primary Examiner* — Daniel P Malley, Jr.
(74) *Attorney, Agent, or Firm* — JCIP Global Inc.

(57) ABSTRACT

The present disclosure provides a thin-film photovoltaic cell with a high photoelectric conversion rate and a preparation process thereof. The thin-film photovoltaic cell comprises a transparent substrate and photovoltaic units which are disposed on the transparent substrate and arranged toward the display module, and the photovoltaic unit disposed in the display area comprises a transparent front electrode disposed on the transparent substrate, a light absorption layer disposed on the transparent front electrode and a transparent back electrode disposed on the light absorption layer; and (Continued)

the photovoltaic unit disposed in the non-display area comprises a transparent front electrode disposed on the transparent substrate, a light absorption layer disposed on the transparent front electrode and a metal back electrode disposed on the light absorption layer.

9 Claims, 4 Drawing Sheets

(51) Int. Cl.
  *H01L 31/18* (2006.01)
  *G06F 1/16* (2006.01)

(56) References Cited

U.S. PATENT DOCUMENTS

| | | | |
|---|---|---|---|
| 10,771,608 B2* | 9/2020 | Thompson | H04M 1/72415 |
| 10,826,001 B2* | 11/2020 | Zhou | G09G 3/3225 |
| 2008/0190482 A1* | 8/2008 | De Jonge | H01L 31/022466 257/E27.125 |
| 2013/0008687 A1* | 1/2013 | Lu | H01L 31/022466 174/119 C |
| 2014/0225090 A1 | 8/2014 | Lee et al. | |

FOREIGN PATENT DOCUMENTS

| | | |
|---|---|---|
| CN | 110165019 | 8/2019 |
| CN | 110277473 | 9/2019 |
| CN | 110518079 | 11/2019 |
| JP | 2010141192 | 6/2010 |

OTHER PUBLICATIONS

"International Search Report (Form PCT/ISA/210) of PCT/CN2020/077010," dated Jun. 23, 2020, pp. 1-5.

* cited by examiner

THIN-FILM PHOTOVOLTAIC CELL WITH HIGH PHOTOELECTRIC CONVERSION RATE AND PREPARATION PROCESS THEREOF

CROSS-REFERENCE TO RELATED APPLICATION

This application is a 371 of international application of PCT application serial no. PCT/CN2020/077010, filed on Feb. 27, 2020, which claims the priority benefit of China application no. 201910931288.7, filed on Sep. 29, 2019. The entirety of each of the above mentioned patent applications is hereby incorporated by reference herein and made a part of this specification.

BACKGROUND

Technical Field

The present disclosure relates to the technical field of thin-film photovoltaic cells, and more specifically to a thin-film photovoltaic cell with a high photoelectric conversion rate and a preparation process thereof.

Description of Related Art

With the increasing demand for energy and the continuous development of thin-film photovoltaic cell technologies, thin-film photovoltaic cells are applied to display modules (for example, wearable electronic products), and the technology of supplying power to the display modules by using the principle of photoelectric conversion is getting more and more widely used.

Generally, a thin-film photovoltaic cell comprises a substrate, a front electrode, a photovoltaic layer and a back electrode, which are sequentially stacked, wherein the thin-film photovoltaic cell is overlaid on a display module and the back electrode side of the thin-film photovoltaic cell is disposed toward the display module. The display module comprises an intermediate display area and a non-display area surrounding the display area. The thin-film photovoltaic cell is usually disposed in the non-display area and covers the non-display area to improve the photoelectric conversion efficiency. In order to further improve the photoelectric conversion efficiency, the display area of the display module may also be provided with the thin-film photovoltaic cell in the form of grid lines to enable the display area to be semi-transparent. However, when a non-transparent metal is used as the back electrode, a wiring area of the display area is a non-transparent area, only one side of the front electrode of the thin-film photovoltaic cell is used for single-side light absorption, and the light of the display module cannot pass through the back electrode and easily causes interference fringes with a display screen.

SUMMARY

In order to solve the deficiencies of the prior art, the present disclosure provides a thin-film photovoltaic cell with a high photoelectric conversion rate and a preparation process thereof. By setting both of a front electrode and a back electrode corresponding to a display area of a display module to be transparent, various light sources may be bidirectionally absorbed on one side facing toward the display module and on one side facing away from the display module at the same time (that is, light emitted by the display module is absorbed on one side facing toward the display module, and natural light or other light sources is/are absorbed on one side facing away from the display module), so that the conversion efficiency of the thin-film photovoltaic cell is improved, especially in weak light conditions.

The technical effects to be achieved by the present disclosure are realized through the following solution: a thin-film photovoltaic cell with a high photoelectric conversion rate is used for disposing on a display surface side of a display module for providing a photoelectric conversion power supply for the display module, wherein the display module comprises a middle display area and a non-display area surrounding the display area, the thin-film photovoltaic cell comprises a transparent substrate and photovoltaic units which are disposed on the transparent substrate and arranged toward the display module, and the photovoltaic unit disposed in the display area comprises a transparent front electrode disposed on the transparent substrate, a light absorption layer disposed on the transparent front electrode and a transparent back electrode disposed on the light absorption layer; and the photovoltaic unit disposed in the non-display area comprises a transparent front electrode disposed on the transparent substrate, a light absorption layer disposed on the transparent front electrode and a metal back electrode disposed on the light absorption layer.

Preferably, the metal back electrode comprises a transparent back electrode and a metal layer disposed on the transparent back electrode.

Preferably, the photovoltaic unit in the non-display area further comprises a transparent insulating layer formed at least between the edge of the transparent back electrode and the edge of the metal layer.

Preferably, the thickness of the transparent back electrode is 50 nm-1000 nm.

Preferably, the photovoltaic unit is further provided with a metal auxiliary electrode, the metal auxiliary electrode is in contact connection with the transparent front electrode, and the metal auxiliary electrode and the metal back electrode are spaced apart by the transparent insulating layer.

A preparation process of the thin-film photovoltaic cell with the high photoelectric conversion rate is characterized by comprising the following steps:

Step S1: providing the transparent substrate and performing film-forming of the transparent front electrodes in the display area and the non-display area on one side of the transparent substrate toward the display module;

Step S2: performing chemical vapor deposition film-forming of the light absorption layer in the display area and the non-display area on the transparent front electrodes;

Step S3: performing film-forming of the transparent back electrodes in the display area and the non-display area on the light absorption layers;

Step S4: sequentially performing etched imaging on the transparent back electrodes, the light absorption layer and the transparent front electrodes after washing;

Step S5: coating the transparent insulating layer with photoresist and exposing the transparent insulating layer subjected to photoresist coating to develop a pattern; and Step S6: performing film-forming and etching of the metal layer in the non-display area on the transparent back electrode to form the metal back electrode.

Preferably, the transparent insulating layer in Step S5 is at least partially formed on the upper surface of the transparent back electrode in the non-display area to space apart the edge part of the metal layer and the edge part of the transparent back electrode by the transparent insulating layer.

Preferably, the preparation process further comprises a step of performing film-forming and etching of the metal auxiliary electrode on the transparent substrate before Step S1 or a step of performing film-forming and etching of the metal auxiliary electrode on the transparent front electrode and the transparent substrate between Step S1 and Step S2.

Preferably, the preparation process further comprises Step S7: performing film-forming and etching of a protecting layer on the metal back electrode in the non-display area.

The present disclosure has the following advantages:

1. By setting both of the front electrode and the back electrode corresponding to the display area of the display module to be transparent, the various light sources may be bidirectionally absorbed on one side facing toward the display module and on one side facing away from the display module at the same time (that is, the light emitted by the display module is absorbed on one side facing toward the display module, and the natural light or the other light sources is/are absorbed on one side facing away from the display module), so that the conversion efficiency of the thin-film photovoltaic cell is improved, especially in the weak light conditions;

2. As both the front electrode and the back electrode are transparent, the wiring of the thin-film photovoltaic cell in the display area is also transparent, so that the transmittance of the display area may be improved, the influence of the interference fringes on an image may also be reduced to a certain extent and the quality of the image of the display module is further improved.

DESCRIPTION OF THE EMBODIMENTS

Figure 1:
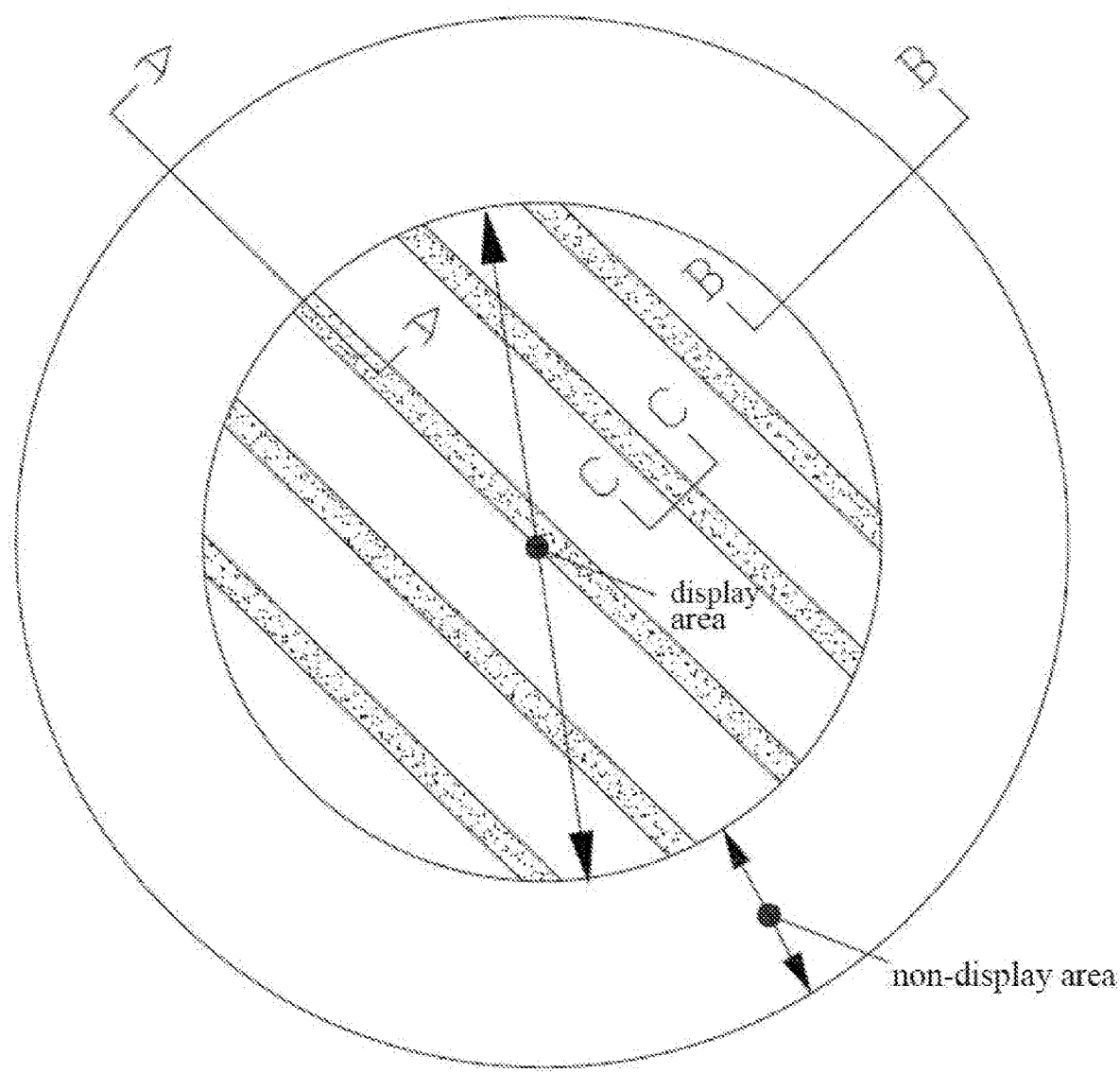
FIG. 1 is a schematic diagram of a plane structure of a thin-film photovoltaic cell with a high photoelectric conversion rate applied on a display module.
Figure 2:
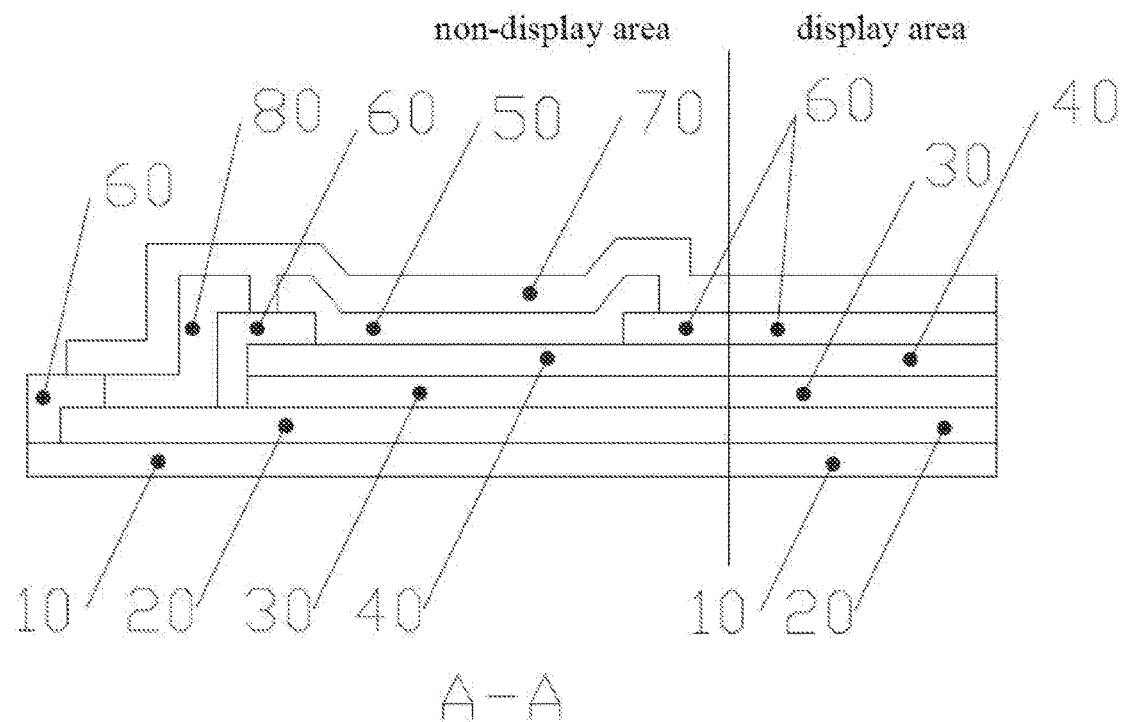
FIG. 2 is a schematic diagram of a sectional structure at A-A in FIG. 1 (the section in which a display area and a non-display area which are both provided with the thin-film photovoltaic cell)
Figure 3:
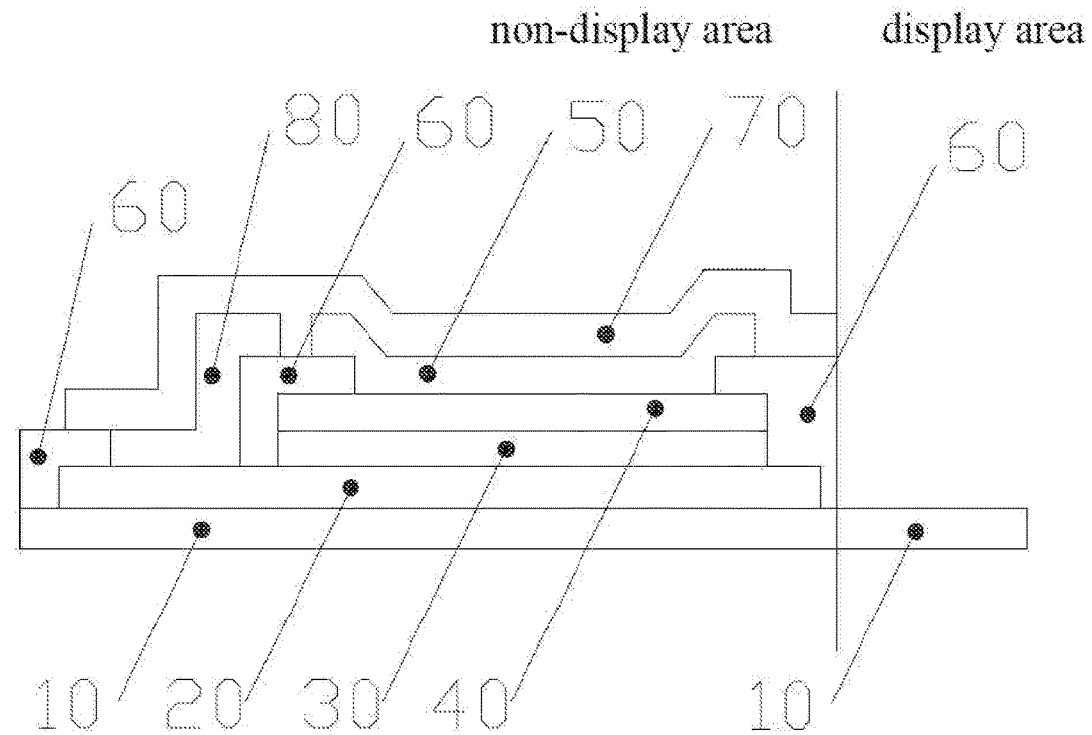
FIG. 3 is a schematic diagram of a sectional structure at B-B in FIG. 1 (the section in which the non-display area is provided with the thin-film photovoltaic cell, while the display area is not provided with the thin-film photovoltaic cell)
Figure 4:
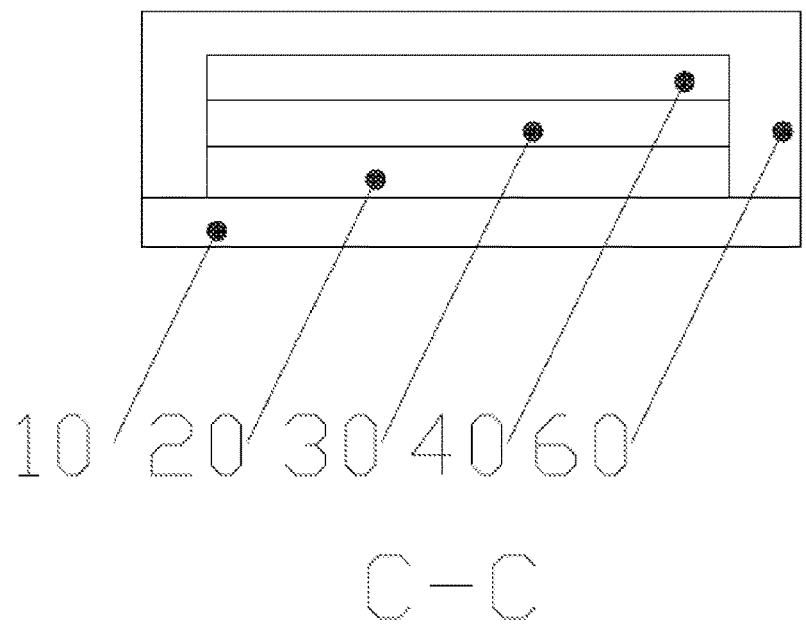
FIG. 4 is a schematic diagram of a sectional structure at C-C in FIG. 1 (the section in which the display area is provided with the thin-film photovoltaic cell)
Figure 5:
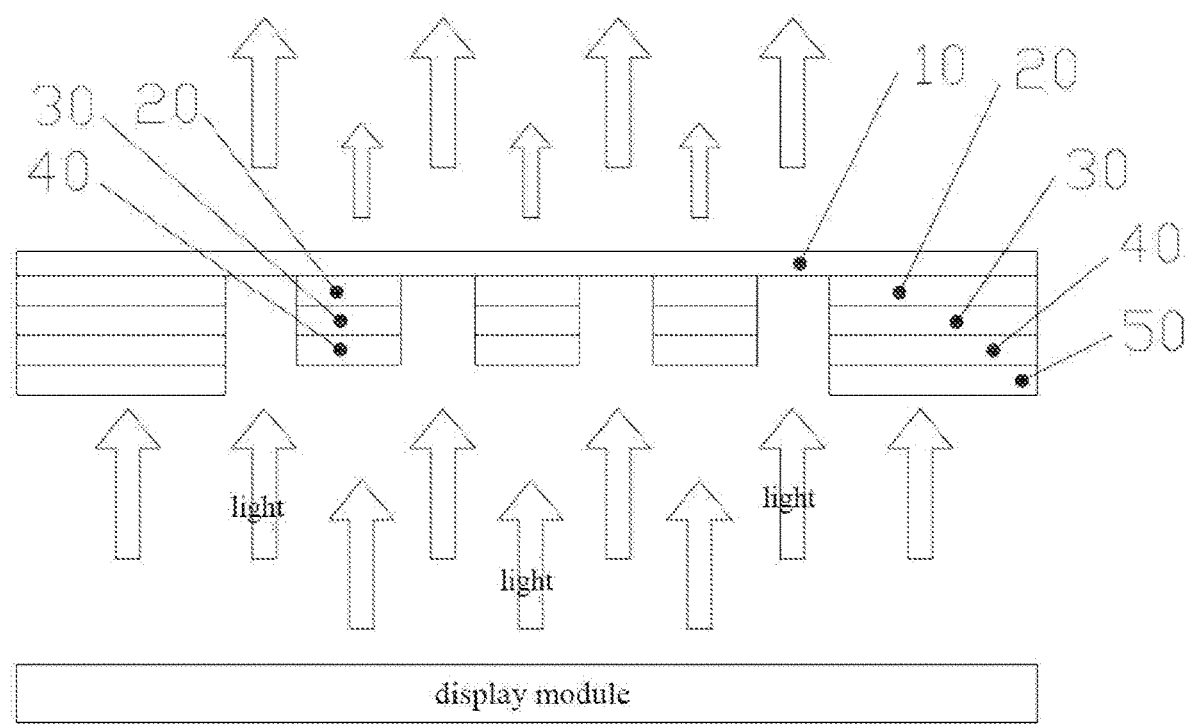
FIG. 5 is a schematic diagram of light incidence of the display module provided with the thin-film photoelectric cell.

The present disclosure will be described in detail below with reference to the drawings and embodiments. Examples of the embodiments are shown in the drawings, in which the same or similar reference numerals indicate the same or similar elements or elements with the same or similar functions. The embodiments described below with reference to the drawings are exemplary, and are intended to explain the present disclosure, and should not be construed as limiting the present disclosure.

In the description of the present disclosure, it is to be understood that the directional or positional relations indicated by the terms "length", "width", "up", "down", "front", "back", "left", "right", "vertical", "horizontal", "top", "bottom", "inside", "outside" and the like are the directional or positional relations shown on the basis of the drawings. They are merely used for facilitating the description of the present disclosure and simplifying the description, rather than indicating and implying that the indicated device or the element must have the specific direction, as well as be constructed and operated in the specific direction. Thus, they cannot be construed as limiting the present disclosure.

In the present disclosure, unless otherwise clearly specified and defined, the terms "installation", "connected", "connection", "fixed", "disposed" and the like should be understood in a broad sense, for example, it may be fixedly connected, detachably connected or integrated; may be mechanically connected or electrically connected; may be directly connected or be indirectly connected through an intermediate medium; and may also refer to the communication in two elements or the interaction relationship between two elements. Those of ordinary skilled in the art may understand the specific meanings of the above terms in the present disclosure according to specific situations.

Embodiment 1

With reference to FIGS. 1-5, Embodiment 1 of the present disclosure provides a thin-film photovoltaic cell with a high photoelectric conversion rate, which is disposed on a display surface side of a display module as a terminal product or a battery for providing an effective power supply, wherein the display module comprises a middle display area and a non-display area surrounding the display area, and the thin-film photovoltaic cell may be formed in the display area of the display module, the non-display area of the display module or both the display area and the non-display area of the display module. When the thin-film photovoltaic cell is formed in the display area of the display module, the thin-film photovoltaic cell may be arranged in the shape of a plurality of spaced lines with the width of less than 50 um to be invisible to the naked eyes (the lines in the display area in FIG. 1 are only used for clear illustration and do not indicate that the width of the cell is visible), so that the observation of an image in the display area of the display module by human eyes is not affected.

The thin-film photovoltaic cell in Embodiment 1 of the present disclosure comprises a transparent substrate 10 and photovoltaic units which are disposed on the transparent substrate 10 and arranged toward the display module, and the photovoltaic unit disposed in the display area comprises a transparent front electrode 20 disposed on the transparent substrate 10, a light absorption layer 30 disposed on the transparent front electrode 20 and a transparent back electrode 40 disposed on the light absorption layer 30; and the photovoltaic unit disposed in the non-display area comprises a transparent front electrode 20 disposed on the transparent substrate 10, a light absorption layer 30 disposed on the transparent front electrode 20 and a metal back electrode disposed on the light absorption layer 30, and the arrangement of the metal back electrode enables the photovoltaic unit in the non-display area to mainly realize a photoelectric conversion function under strong light.

According to Embodiment 1 of the present disclosure, by setting both of the front electrode and the back electrode corresponding to the display area of the display module to be transparent, various light sources may be bidirectionally absorbed on one side facing toward the display module and on one side facing away from the display module at the same time (that is, light emitted by the display module is absorbed on one side facing toward the display module, and natural light or other light sources is/are absorbed on one side facing away from the display module), so that the photoelectric conversion efficiency of the display area of the thin-film photovoltaic cell is improved, especially in weak light conditions.

In addition, compared with the display area using the metal back electrode in the prior art, both the front electrode and the back electrode in the display area of the present application are transparent, so that the wiring of the thin-film photovoltaic cell in the display area is also transparent, the transmittance of the display area may be improved, the influence of interference fringes on an image may also be reduced to a certain extent relative to the non-transparent wiring and the quality of the image of the display module is further improved.

As a further improvement of Embodiment 1 of the present disclosure, due to the relatively large resistance of the transparent electrode, the thickness of the transparent back electrode 40 is 50 nm-1000 nm and thus thicker than that of a traditional metal layer. Thus, on the premise of ensuring light absorption, the resistance of the transparent back electrode is reduced as much as possible, the absorption of the strong light by a photovoltaic device is relatively improved and the efficiency of the device is improved. It should be understood that the specific thickness of the transparent back electrode 40 may be selected according to a material adopted by the transparent back electrode 40. For example, when the material adopting indium tin oxide (ITO) is adopted, it may be thinner than the material adopting aluminum-doped zinc oxide (AZO).

Preferably, the metal back electrode comprises a transparent back electrode 40 and a metal layer 50 disposed on the transparent back electrode 40, and film-forming is simultaneously performed on the transparent back electrode 40 in the non-display area and the display area, so that the preparation process may be simpler and more convenient. The metal layer 50 may be Al, Ag, Au, Cu and other materials with good conductivity.

As a further improvement of the embodiment of the present disclosure, the thin-film photovoltaic cell further comprises a transparent insulating layer 60, the transparent insulating layer 60 is formed at least between the edge of the transparent back electrode 40 and the edge of the metal layer 50, and then the edge part of the metal layer 50 and the edge part of the transparent back electrode 40 are spaced by the transparent insulating layer 60, so that the metal layer 50 cannot corrode the transparent back electrode 40 during etching.

The transparent insulating layer 60 is also formed on the transparent back electrode 40 in the display area to play a role in protecting the display area.

When the transparent insulating layer 60 adopts a transparent organic matter, it may be prepared by photoresist coating, exposing and developing, transfer printing or screen printing, and the process is simpler. The transparent insulating layer 60 in the display area mainly protects the photovoltaic unit in the display area. The transparent insulating layer 60 in the non-display area has the functions of spacing a metal auxiliary electrode 80 and the transparent back electrode 40 to prevent short circuit, and spacing the metal layer 50 and the transparent back electrode 40 to prevent the transparent back electrode 40 from being etched.

When the transparent insulating layer 60 adopts SiNx, SiO$_2$ and other non-metals with relatively high transparency, film-forming may be performed by chemical vapor deposition (CVD) or magnetron sputtering, etc., then a pattern is made by linear exposure of yellow light and then dry-etched to form pattern lines, the positions without photovoltaic wiring in the display area may be etched away and the overall transmittance of the device is improved.

The materials of the transparent front electrodes 20 and the transparent back electrodes 40 may be transparent metal oxides, such as AZO, ITO, fluorine-doped tin oxide (FTO), etc., or other transparent conductive materials, such as carbon nanotubes, metal nanowires, graphene and conductive polymers, etc.

As a further improvement of the embodiment of the present disclosure, the photovoltaic unit in the non-display area is further provided with the metal auxiliary metal 80, the metal auxiliary metal 80 is in contact connection with the transparent front electrode 20, the metal auxiliary electrode 80 and the metal back electrode are spaced by the transparent insulating layer 60, and the metal auxiliary electrode 80 is used to reduce the resistance of the transparent front electrode 20 and improve the photoelectric conversion efficiency of the thin-film photovoltaic cell under the strong light. More preferably, the metal auxiliary electrode 80 is correspondingly disposed at the periphery of the non-display area. Preferably, the metal auxiliary electrode 80 and the metal layer 50 may be spaced on the transparent insulating layer 60 by chemical etching.

As a further improvement of the embodiment of the present disclosure, the outermost layers of the photovoltaic unit in the non-display area and the photovoltaic unit in the display area are further provided with protecting layers 70, and the protecting layers 70 may adopt organic matters or non-metal substances, such as SiNx or SiO$_2$ with relatively strong hardness, and the non-metal protecting layer may better prevent scratches and other defects caused in the preparation process from affecting the performance of the thin-film photovoltaic cell.

In Embodiment 1 of the present disclosure, the display module is circular in shape, the display area and the non-display area are also circular or annular in shape, and the shape may change according to actual product applications and is not limited in the present application.

The thin-film photovoltaic cell in Embodiment 1 of the present disclosure may be composed of a single cell or a plurality of cells by connection in series. The thin-film photovoltaic cell in the display area is preferably in the shape of thin lines with the width of less than 50 μm, which are invisible to the naked eyes, and the wiring of the thin-film photovoltaic cell in the display area may be intermittently connected on the thin-film photovoltaic cell of the display area.

Embodiment 2

Figure 6:
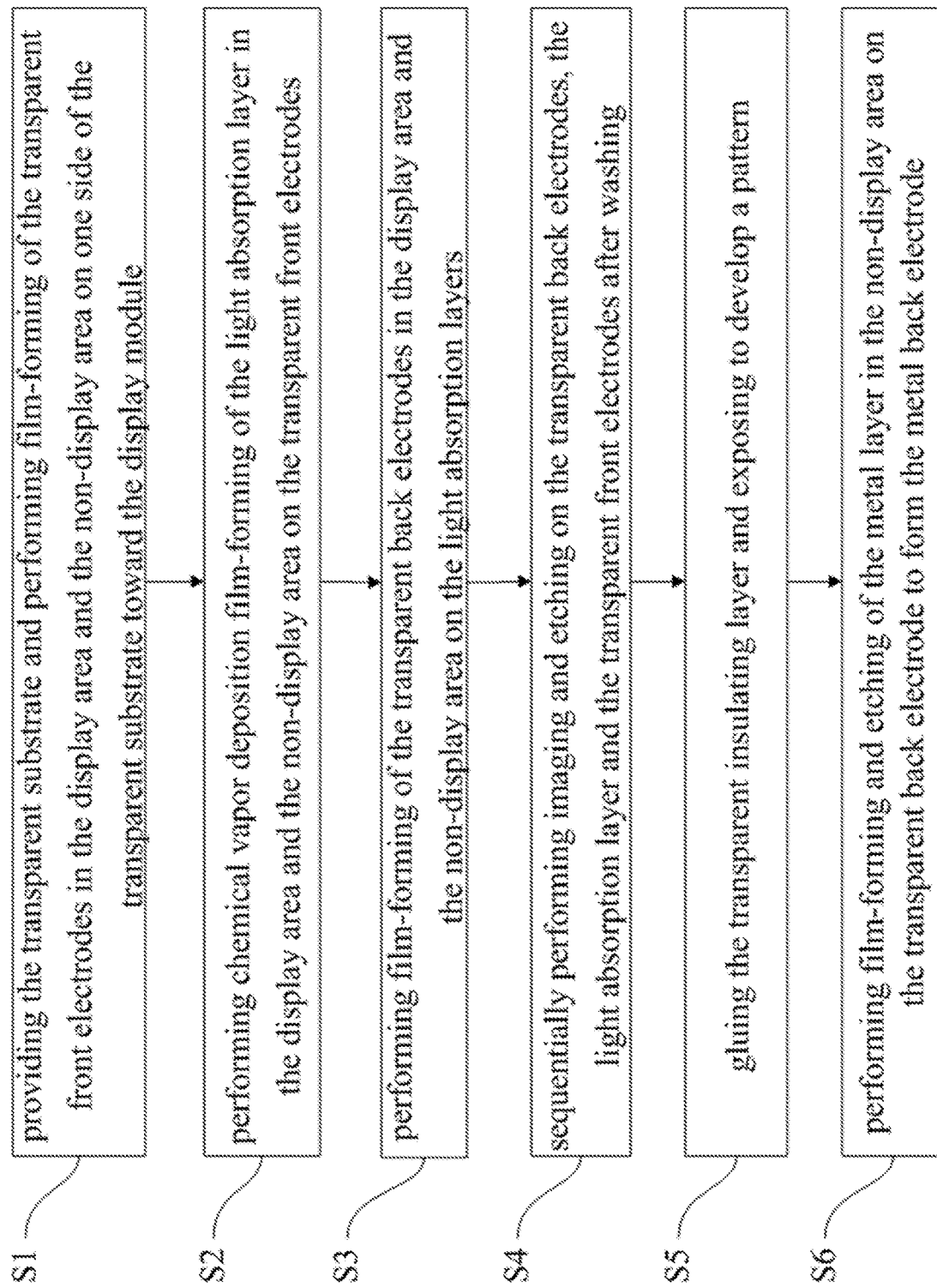
FIG. 6 is a schematic flowchart of a preparation process of the thin-film photovoltaic cell with the high photoelectric conversion rate of the present disclosure.

As shown in FIG. 6, Embodiment 2 of the present disclosure provides a preparation process of a thin-film photovoltaic cell with a high photoelectric conversion rate, comprising the following steps:

Step S1: the transparent substrate 10 is provided and film-forming of the transparent front electrodes 20 in the display area and the non-display area is performed on one side of the transparent substrate 10 toward the display module, Specifically, the transparent front electrodes 20 may adopt one or a combination of AZO, ITO, FTO and other materials, and may also have other transparent conductive substances, such as carbon nanotubes, metal nanowires, graphene, conductive polymers and the like. When used in combination, AZO is in contact with the light absorption layers 30 to reduce the contact resistance. Wherein, the film-forming temperature of AZO is 200-350° C., and the film-forming thickness is 50 nm-1000 nm; for ITO, film-forming may be performed at a normal temperature, the film thickness is 500 Å-3000 Å, preferably, the temperature of 235° C. or above is adopted, and annealing is performed to reduce the resistance of ITO; and for AZO, low-concentration HCl or alkaline substances may be selected for texturing to form a rough surface, so as to improve the absorption of solar reflected light.

Step S2: chemical vapor deposition film-forming of the light absorption layers 30 in the display area and the non-display area is performed on the transparent front electrodes 20.

Specifically, the light absorption layers 30 are divided into P layers, I layers, and N layers, wherein the thickness of the P layers is 10 nm-100 nm, and the film-forming temperature is 150° C.-280° C.; the thickness of the I layers is 200 nm-700 nm, and the film-forming temperature is 150° C.-280° C.; and the thickness of the N layers is 20 nm-150 nm, and the film-forming temperature is 150° C.-230° C.

Step S3: film-forming of the transparent back electrodes 40 in the display area and the non-display area is performed on the light absorption layers 30.

Specifically, the transparent back electrodes 40 may adopt one or a combination of AZO, ITO, FTO and other materials, and may also have other transparent conductive substances, such as carbon nanotubes, metal nanowires, graphene, conductive polymers and the like. When used in combination, AZO is in contact with the light absorption layers 30 to reduce the contact resistance. Wherein, the film-forming temperature of AZO is 200-350° C., and the film-forming thickness is 50 nm-1000 nm; for ITO, film-forming may be performed at a normal temperature, the film thickness is 500 Å-3000 Å, preferably, the temperature of 235° C. or above is adopted, and annealing is performed to reduce the resistance of ITO; and for AZO, low-concentration HCl or alkaline substances may be selected for texturing to form a rough surface, so as to improve the absorption of solar energy.

Step S4: etched imaging is sequentially performed on the transparent back electrodes 40, the light absorption layers 30 and the transparent front electrodes 20 after sequentially washing.

The transparent back electrodes 40 and the transparent front electrodes 20 may adopt chemical etching after photoresist coating and exposed imaging; and the light absorption layers 30 may perform etching by dry-etching, and $Cl_2$/Ar and $SF_6$ gases may be selected-here, the main point is that dry-etching is directly performed without demolding treatment of a photoresist before dry-etching, so that the process step is omitted.

Step S5: the transparent insulating layer 60 is glued, a pattern is developed by exposure, the transparent insulating layer 60 is at least partially formed on the upper surface of the transparent back electrode 40 in the non-display area, and the transparent insulating layer 60 at least needs to space apart the edge part of the metal layer 50 and the edge part of the transparent back electrode 40 by the transparent insulating layer 60.

The transparent insulating layer 60 spacing apart the metal layer 50 and the transparent back electrode 40 in Step S5 has the function of preventing an etchant from flowing to be in contact with the transparent back electrode 40 during etching of the metal layer 50, thereby preventing the etchant from corroding away the transparent back electrode 40.

The transparent insulating layer 60 is also formed on the transparent back electrode 40 in the display area to realize a protecting function.

When the transparent insulating layer 60 adopts a transparent organic matter, it may be prepared by photoresist coating, exposing and developing, transfer printing or screen printing, and the process is simpler. The transparent insulating layer 60 in the display area mainly protects the photovoltaic unit in the display area. The transparent insulating layer 60 in the non-display area has the functions of spacing the metal auxiliary electrode 80 and the transparent back electrode 40 to prevent short circuit, and spacing the metal layer 50 and the transparent back electrode 40 to prevent the transparent back electrode 40 from being etched.

When the transparent insulating layer 60 adopts SiNx, $SiO_2$ and other non-metals with the relatively high transparency, film-forming may be performed by chemical vapor deposition (CVD) or magnetron sputtering, etc., then the pattern is made by linear exposure of the yellow light and then dry-etched to form the pattern lines, the positions without photovoltaic wiring in the display area may be etched away and the overall transmittance of the device is improved.

Step S6: film-forming and etching of the metal layer 50 in the non-display area are performed on the transparent back electrode 40 to form the metal back electrode, wherein the metal layer 50 extends to the upper surface of the transparent insulating layer 60 to space apart the edge part of the metal layer 50 and the edge part of the transparent back electrode 40 by the transparent insulating layer 60.

In Step S6, the metal layer 50 is further made on the transparent back electrode 40 in the non-display area to form the metal back electrode. Compared with the direct making of the metal layer 50 in the prior art, the process is simpler and more convenient, and the arrangement of the metal layer 50 effectively improves the photoelectric conversion efficiency under the strong light.

In the preparation process of Embodiment 2 of the present disclosure, by making both of the front electrode and the back electrode corresponding to the display area of the display module to be transparent, the various light sources may be bidirectionally absorbed on one side facing toward the display module and on one side facing away from the display module at the same time (that is, the light emitted by the display module is absorbed on one side facing toward the display module, and the natural light or the other light sources is/are absorbed on one side facing away from the display module), so that the conversion efficiency of the thin-film photovoltaic cell is improved, especially in the weak light conditions.

In addition, as both the front electrode and the back electrode are transparent, compared with the back electrode made of a non-transparent metal, the wiring of the thin-film photovoltaic cell in the display area is also relatively transparent, so that the transmittance of the display area is improved, the influence of the interference fringes on the image may also be reduced and the quality of the image of the display module is further improved.

When the hardness of the transparent organic matter adopted by the transparent insulating layer 60 in Step S5 is relatively low, the outermost layer of the photovoltaic unit in the display area may also select SiNx, $SiO_2$ and other non-metals as the protecting layer. Thus, Embodiment 2 of the present disclosure further comprises Step S7: performing film-forming and etching of the protecting layer on the transparent back electrode 40 in the display area and on the metal electrode in the non-display area.

Embodiment 2 of the present disclosure further comprises a step of performing film-forming and etching of the metal auxiliary electrode on the transparent substrate 10 before Step S1 (the metal auxiliary electrode 80 is formed on the lower surface of the transparent front electrode 20) or a step of performing film-forming and etching of the metal auxiliary electrode 80 on the transparent front electrode 20 and the transparent substrate 10 between Step S1 and Step S2 (the metal auxiliary electrode 80 is formed on the upper surface of the transparent front electrode 20), the structure of film layers of the metal auxiliary electrode 80 is that a first Mo layer, the auxiliary metal layer and a second Mo layer may be sequentially stacked on the transparent substrate 10, wherein the auxiliary metal layer may adopt Al, Ag, Au, Cu and other materials with good conductivity, the first Mo layer may improve the adhesion of the intermediate auxiliary metal layer to the transparent substrate 10, the second Mo layer may realize a protecting function, and the second Mo layer may also use a metal with low activity, wherein the film-forming temperature of the metal auxiliary electrode 80 is 40° C.-230° C., the thickness of the first Mo layer may be 500 Å, the thickness of the auxiliary metal layer may be 2000 Å-5000 Å, and the thickness of the second Mo layer may be 500 Å.

In Embodiment 2 of the present disclosure, the metal auxiliary electrode 80 is used to connect the transparent front electrode 20, which effectively reduces the resistance of the transparent front electrode 20 and improves the efficiency. At the same time, the metal layer 50 is also connected to the transparent back electrode 40 in the non-display area, so that the conversion efficiency of the non-display area under the strong light is improved, and the process is simpler.

As a further improvement of Embodiment 2 of the present disclosure, the preparation process steps further comprise a step of respectively texturing the transparent front electrode 20 and the transparent back electrodes 40 to form the rough surfaces, thereby being capable of enhancing the light scattering ability, increasing the absorption light path for light in the thin-film photovoltaic cell, further improving the short-circuit current density of the thin-film photovoltaic cell and improving the efficiency of the device.

Finally, it should be noted that, the above embodiments are merely used for explaining the technical solutions of the embodiments of the present disclosure, rather than limiting the present disclosure. Although the embodiments of the present disclosure are described in detail with reference to the preferred embodiments, those of ordinary skilled in the art should understand that the technical solutions of the embodiments of the present disclosure may still be modified or be substituted equivalently, and these modifications or equivalent substitutions may not enable the technical solutions after modifications to depart from the scope of the technical solutions of the embodiments of the present disclosure.

What is claimed is:

1. A thin-film photovoltaic cell for disposing on a display surface side of a display module, wherein the display module comprises a middle display area and a non-display area surrounding the display area, characterized in that:
    the thin-film photovoltaic cell comprises a transparent substrate and photovoltaic units which are disposed on the transparent substrate, on a side of the transparent substrate that is facing toward the display module, and the photovoltaic units disposed in the display area comprises a transparent front electrode disposed on the transparent substrate, a light absorption layer disposed on the transparent front electrode and a transparent back electrode disposed on the light absorption layer; and
    the photovoltaic units disposed in the non-display area comprises the transparent front electrode disposed on the transparent substrate, the light absorption layer disposed on the transparent front electrode and the transparent back electrode disposed on the light absorption layer, and a metal layer disposed on the transparent back electrode in the non-display area, and wherein the metal layer is not disposed on the display area wherein the thin-film photovoltaic cell further comprises a transparent insulating layer formed between an edge of the transparent back electrode and an edge of the metal layer.

2. The thin-film photovoltaic cell according to claim 1, characterized in that the thickness of the transparent back electrode is 50 nm-1000 nm.

3. The thin-film photovoltaic cell according to claim 1, characterized in that the photovoltaic unit in the non-display area is further provided with a metal auxiliary electrode, the metal auxiliary electrode is in contact connection with the transparent front electrode, and the metal auxiliary electrode and the metal layer are spaced apart by the transparent insulating layer.

4. A preparation process of the thin-film photovoltaic cell as claimed in claim 1, characterized in that comprising the following steps:
    Step S1: providing the transparent substrate and performing film-forming of the transparent front electrode in the display area and the non-display area on one side of the transparent substrate facing toward the display module;
    Step S2: performing chemical vapor deposition film-forming of the light absorption layer in the display area and the non-display area on the transparent front electrode;
    Step S3: performing film-forming of transparent back electrode in the display area and the non-display area on the light absorption layer;
    Step S4: sequentially performing etched imaging on the transparent back electrode, the light absorption layer and the transparent front electrodes after washing;
    Step S5: coating a transparent insulating layer with photoresist and exposing the transparent insulating layer subjected to photoresist coating to develop a pattern; and
    Step S6: performing film-forming and etching of the metal layer in the non-display area on the transparent back electrode.

5. The preparation process of the thin-film photovoltaic cell according to claim 4, characterized in that the transparent insulating layer in the Step S5 is at least partially formed on an upper surface of the transparent back electrode in the non-display area to space apart an edge part of the metal layer and an edge part of the transparent back electrode by the transparent insulating layer.

6. The preparation process of the thin-film photovoltaic cell according to claim 4, characterized in that the preparation process further comprises a step of performing film-forming and etching of a metal auxiliary electrode on the transparent substrate before Step S1 or a step of performing film-forming and etching of the metal auxiliary electrode on the transparent front electrode and the transparent substrate between Step S1 and Step S2.

7. The preparation process of the thin-film photovoltaic cell according to claim 4, characterized in that the preparation process further comprises Step S7: performing film-forming and etching of a protecting layer on the metal layer in the non-display area.

8. A preparation process of the thin-film photovoltaic cell as claimed in claim 2, characterized in that comprising the following steps:
   Step S1: providing the transparent substrate and performing film-forming of the transparent front electrode in the display area and the non-display area on one side of the transparent substrate facing toward the display module;
   Step S2: performing chemical vapor deposition film-forming of the light absorption layer in the display area and the non-display area on the transparent front electrode;
   Step S3: performing film-forming of transparent back electrode in the display area and the non-display area on the light absorption layer;
   Step S4: sequentially performing etched imaging on the transparent back electrode, the light absorption layer and the transparent front electrodes after washing;
   Step S5: coating a transparent insulating layer with photoresist and exposing the transparent insulating layer subjected to photoresist coating to develop a pattern; and
   Step S6: performing film-forming and etching of the metal layer in the non-display area on the transparent back electrode.

9. A preparation process of the thin-film photovoltaic cell as claimed in claim 3, characterized in that comprising the following steps:
   Step S1: providing the transparent substrate and performing film-forming of the transparent front electrode in the display area and the non-display area on one side of the transparent substrate facing toward the display module;
   Step S2: performing chemical vapor deposition film-forming of the light absorption layer in the display area and the non-display area on the transparent front electrode;
   Step S3: performing film-forming of transparent back in the display area and the non-display area on the light absorption layer;
   Step S4: sequentially performing etched imaging on the transparent back electrode, the light absorption layer and the transparent front electrode after washing;
   Step S5: coating a transparent insulating layer with photoresist and exposing the transparent insulating layer subjected to photoresist coating to develop a pattern; and
   Step S6: performing film-forming and etching of the metal layer in the non-display area on the transparent back electrode.

* * * * *